United States Patent
Yin et al.

(10) Patent No.: US 12,087,384 B2
(45) Date of Patent: Sep. 10, 2024

(54) BIAS VOLTAGE GENERATION CIRCUIT FOR MEMORY DEVICES

(71) Applicant: GLOBALFOUNDRIES U.S. Inc., Malta, NY (US)

(72) Inventors: Ming Yin, Suffern, NY (US); Bipul C. Paul, Mechanicville, NY (US); Nishtha Gaul, Halfmoon, NY (US); Shashank Nemawarkar, Austin, TX (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 157 days.

(21) Appl. No.: 17/668,962

(22) Filed: Feb. 10, 2022

(65) Prior Publication Data

US 2023/0253017 A1    Aug. 10, 2023

(51) Int. Cl.
G11C 5/14    (2006.01)

(52) U.S. Cl.
CPC .............. G11C 5/147 (2013.01); G11C 5/148 (2013.01)

(58) Field of Classification Search
CPC .......... G11C 5/147; G11C 5/148; G11C 5/145
See application file for complete search history.

(56) References Cited

U.S. PATENT DOCUMENTS

| | | |
|---|---|---|
| 5,506,541 A | 4/1996 | Herndon |
| 5,914,681 A | 6/1999 | Rundel |
| 6,163,493 A * | 12/2000 | Yamagata ............... G11C 5/147 365/230.06 |
| 8,026,703 B1 | 9/2011 | Damaraju et al. |
| 8,817,550 B1 * | 8/2014 | Oh ......................... G11C 7/1069 365/189.11 |
| 11,289,135 B1 * | 3/2022 | Nakazawa ............. G11C 7/222 |
| 2002/0041531 A1 * | 4/2002 | Tanaka ................ H01L 27/0222 365/205 |
| 2003/0081490 A1 * | 5/2003 | Nagasawa ........ G11C 29/12005 365/230.03 |
| 2008/0284527 A1 * | 11/2008 | Kim .......................... H03L 7/18 331/17 |
| 2009/0267684 A1 * | 10/2009 | Do .......................... G05F 1/465 327/540 |
| 2010/0188140 A1 | 7/2010 | Smeloy |
| 2011/0158021 A1 * | 6/2011 | Wiatrowski ............. G11C 7/12 365/203 |

OTHER PUBLICATIONS

Chih et al. "A 22nm 32Mb Embedded STT-MRAM with 10ns Read Speed, 1M Cycle Write Endurance, 10 Years Retention at 150° C. and High Immunity to Magnetic Field Interference", 2020 IEEE International Solid-State Circuits Conference—(ISSCC), Feb. 16-20, 2020, Abstract 2 pages.

* cited by examiner

*Primary Examiner* — Khamdan N. Alrobaie
(74) *Attorney, Agent, or Firm* — David Cain; Andrew M. Calderon; Calderon Safran & Wright, PC

(57) ABSTRACT

The present disclosure relates to memory devices and, more particularly, to bias voltage generation circuit for memory devices and methods of operation. The voltage generation circuit includes: an internal voltage generator which providing a bias voltage to at least one internal node of a bias voltage generation circuitry; and at least one pre-charging circuitry providing a predefined bias voltage to at least one internal node including a distributed network of local drivers.

16 Claims, 7 Drawing Sheets

BIAS VOLTAGE GENERATION CIRCUIT FOR MEMORY DEVICES

BACKGROUND

The present disclosure relates to memory devices and, more particularly, to bias voltage generation circuits for memory devices and methods of operation.

Existing bias voltage generation has slow wake-up times from deep power down (DPD)/sleep state to the first read operation ready. For example, existing bias voltage provides a slow wakeup time: >1 µs, full power grids with a heavy capacitive load and, hence, slow wake-up time. Also, the existing bias voltage generation includes circuitry that uses large power consumption for driving a large load.

SUMMARY

In an aspect of the disclosure, an apparatus comprises: an internal voltage generator which providing a bias voltage to at least one internal node of a bias voltage generation circuitry; and at least one pre-charging circuitry providing a predefined bias voltage to the at least one internal node including a distributed network of local drivers.

In an aspect of the disclosure, a voltage bias generator comprises: a first predefined voltage generator which generates an internal voltage bias to at least one internal node; a first internal voltage generator which generates a final internal voltage bias to the at least one internal node; and a distributed final local driver which receives the final internal voltage bias and provides a local final bias to memory blocks for non-volatile memory operation.

In an aspect of the disclosure, a method comprises: providing a predefined bias voltage to at least one internal node of a bias voltage generation circuitry; and providing a final bias voltage to the at least one internal node and providing a final bias voltage by using distributed local drivers of the bias voltage generation circuitry.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to memory devices and, more particularly, to bias voltage generation circuitry for memory devices and methods of operation. More specifically, the present disclosure relates to bias voltage generation circuitry used in non-volatile memory to improve wake-up time/recovery from a standby or sleep mode. Advantageously, the bias voltage generation circuitry provides reduced wake-up time for read operations of non-volatile memory, in addition to optimizing power consumption due to load management.

In embodiments, the voltage generation circuitry generates an internal bias voltage to perform read operations in non-volatile memory. More specifically, the voltage generation circuitry achieves fast wake-up time by generating an internal bias voltage. In embodiments, the internal bias voltage may be a pulse controlled internal voltage to speed-up wake-up from a standby mode. The pulsed controlled internal voltage may be a predefined voltage close to the final voltage value of the nodes, which helps to reduce wake-up time. In addition, in the distributed bias voltage configuration, each distributed local driver only needs to drive a local load, which results in few capacitive loads from decoupling of capacitors and the much smaller power grid. Additional local drivers may be used to speed-up wake-up, with the additional drivers only turning on during wake-up, then turning off to save power.

Figure 1:
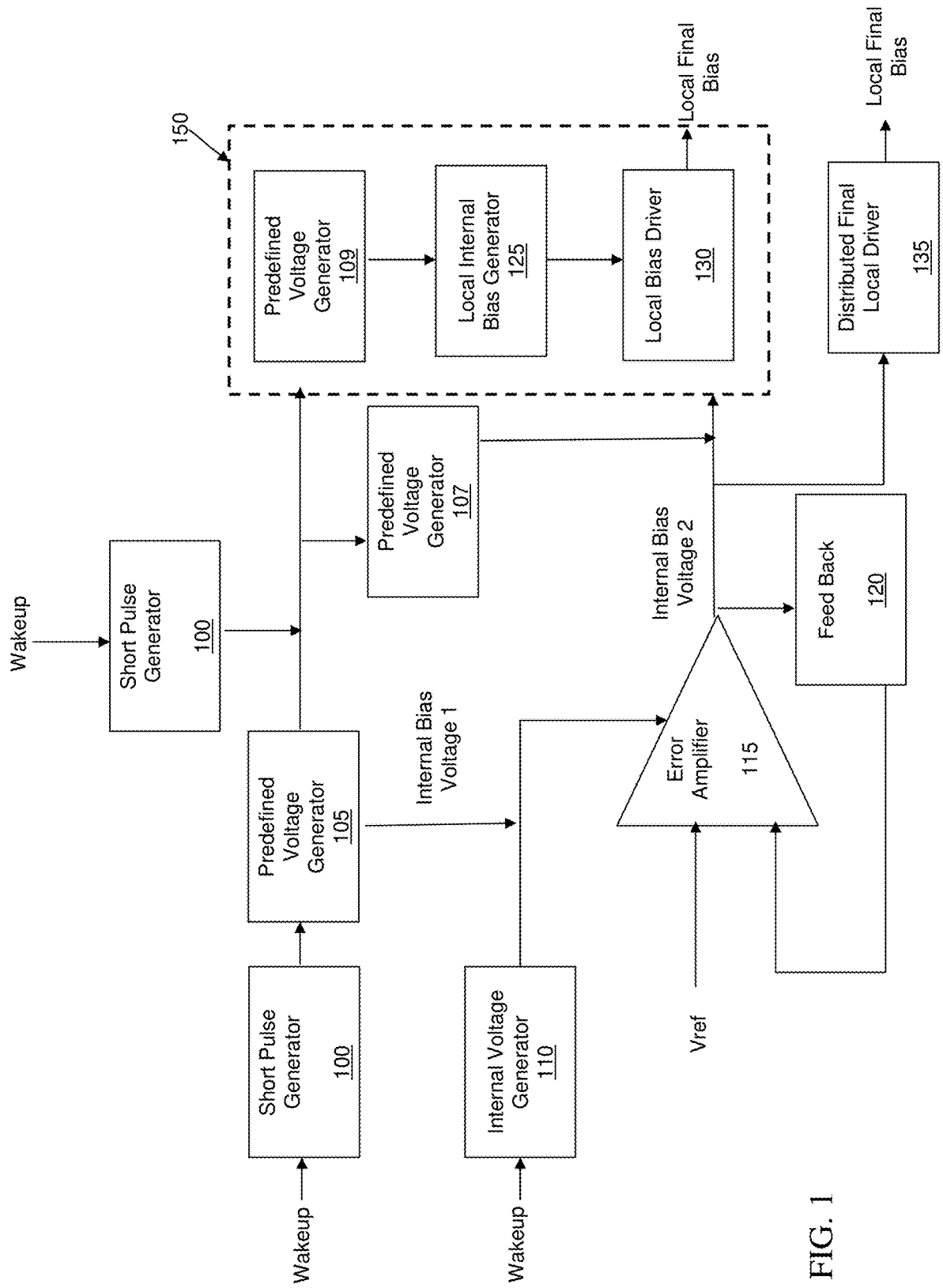
FIG. 1 shows a block diagram of the voltage generation circuitry in accordance with aspects of the present disclosure.

FIG. 1 shows a block diagram of the voltage generation circuitry (e.g., stabilization circuitry) in accordance with aspects of the present disclosure. In embodiments, the voltage generation circuitry includes a short pulse generator 100 connected to one or more predefined voltage generators 105, 107, 109. In embodiments, by utilizing the predefined voltage generator 105, 107, 109, it is possible to provide faster internal bias voltages to a plurality of local voltage drivers 130, 135 to thereby reduce wake-up times.

In embodiments, the predefined voltage generator 105 may be upstream of an error amplifier 115. A feedback control 120 provides feedback to the error amplifier 115 in order for the error amplifier 115 to compare a reference voltage, e.g., Vref, and the final voltage, e.g., internal bias voltage 2, by using the internal bias voltage 1, which is generated from the internal voltage generator 110. Moreover, the predefined voltage generator 107 may be downstream of the error amplifier 115 and upstream of distributed local drivers 130, 135. Also, the predefined voltage generator 109 may be part of the distributed final local driver 150, upstream from an internal bias generator 125 and local bias driver 130. In this configuration, the predefined voltage generators 105, 107, 109 may be used to generate a predefined voltage for internal nodes (e.g., error amplifier, distributed final local driver 135, etc.) to reduce wake-up time of the non-volatile memory.

The short pulse generator 100 generates a single pulse, e.g., of short duration, to turn on the predefined voltage generator(s) 105, 107, 109. In embodiments, the internal bias voltage, e.g., internal bias voltage 1, when first generated by the predefined voltage generator 105, may be close to the final voltage generated by internal bias generators 110. In more specific embodiments, e.g., internal bias voltage 1 and internal bias voltage 2, the internal bias voltages generated from the predefined voltage generators, e.g., 105 and 107, may be less than or more than the final voltages generated from the internal voltage generator and/or error amplifier, e.g., 110 and 115. In further embodiments, the internal bias voltages generated from the predefined voltage generators 105,107, 109, e.g., internal bias voltage 1, may be about a 10% difference of the voltage generated by the internal voltage generator 110. For example, the initial internal bias voltage 1 generated from predefined voltage generator 105, may be 0.4V or other voltage that is close to the final voltage (e.g., 0.43V) needed for wake-up. As the internal bias generator 110 is an analog circuit, it may be slow from wake-up to generate the desired internal bias voltage 1, hence the predefined voltage generator 105 may be used to provide an initial voltage, e.g., 0.4V until the internal bias generator 110 fully wakes-up to generate the final desired voltage. In this way, the predefined voltage generator(s) 105, 107, 109 can significantly reduce wake-up time.

In operation, upon receiving a wake-up signal, the short pulse generator 100 may generate a single pulse of duration, e.g., less than 100 ns, which turns on the predefined voltage generator(s) 105, 107, 109. A reference signal Vref may also be input into the error amplifier 115. The error amplifier 115 may receive the bias voltage of the predefined voltage generator 105 and use it to compare Vref to the final voltage via the feedback control 120. In embodiments, in order to avoid internal conflict, the defined voltage generator(s) 105 and the internal bias generator 110 should not be allowed to pass their generated voltages to internal bias voltage 1 at the same time.

Still referring to the operation of the circuitry, the predefined voltage generator(s) 105, 107, 109 may be turned on and off at the same time or at different times. For example, the predefined voltage generator(s) 107, 109 may be turned off at a different time than the predefined voltage generator 105, depending on the capacitive loading. Illustratively, the predefined voltage generator 107 may remain on until the capacitive loading is fully charged. In embodiments, the predefined voltage generator(s) 105, 107, 105*b* may be turned off after providing the predefined voltage, e.g., the predefined voltage generator(s) 105, 107, 109 only turns on for a short time. Moreover, the initial voltage of the predefined voltage generator(s) 107, 109 may be higher, e.g., 0.6V, than the voltage of the predefined voltage generator 105.

In addition, the predefined voltage generator 109 may provide an initial local bias voltage to the local internal bias generator 125. In embodiments, the predefined voltage generator 109 can be turned on at a same time as the predefined voltage generator 105, and may be used to provide a predefined voltage to the local driver, e.g., local bias driver 130. In this way, in combination with the local internal bias generator 125, the local final bias time for a read operation can be reduced, e.g., wake-up time may be reduced. Accordingly, the voltage generation circuitry is optimized to achieve a faster read access from a sleep state than can be accomplished with conventional circuitry.

In this way, the voltage bias circuit may include two stages. A first stage in which an array of local bias drivers control the bias and during a second stage, a global bias driver controls the bias.

Figure 2:
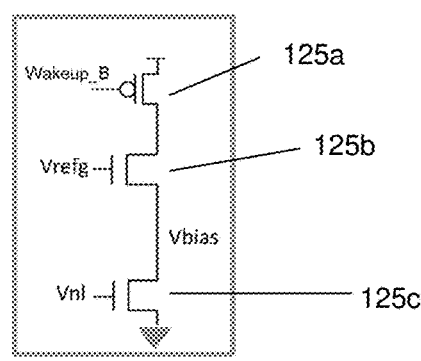
FIG. 2 shows a representative local bias generator in accordance with aspects of the present disclosure.

FIG. 2 shows a representative local bias generator shown in FIG. 1. In particular, the local bias generator may be representative of local bias generator 130. In embodiments, the local bias generator includes a series of FETs, e.g., PFET 125*a* and NFETS 125*b*, 125*c*. In embodiments, the PFET 125*a* receives the wake-up signal, which turns on the local bias generator. The NFET 125*b* receives a reference voltage, Vrefg. In embodiments, the reference voltage may be 0.5V as an illustrative example, which may be obtained by the error amplifier of FIG. 1. In embodiments, Vnl controls the NFET 125*c*.

Figure 3:
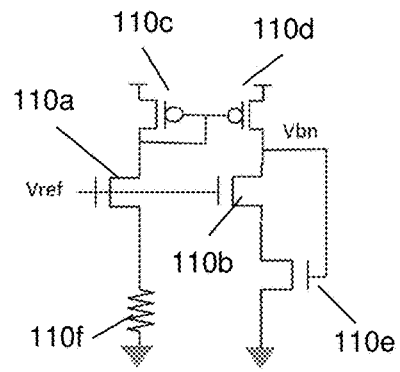
FIG. 3 shows a representative internal bias generator in accordance with aspects of the present disclosure.

FIG. 3 shows a representative internal bias generator of FIG. 1. In particular, the internal bias generator may be representative of the internal bias generators 110, 125. In embodiments, the internal bias generator may include a series of transistors, e.g., NFETS 110*a*, 110*b*, 110*e*, and PFETS 110*c*, 100*d*. In embodiments, the NFETS 110*a*, 110*b* may receive a wake-up signal gated Vref as an input. At this operational stage, the PFETS 110*c*, 100*d* may be used to generate an output (e.g., final voltage, Vbn), which is fed through the NFET 110*e* to a local bias driver, e.g., local bias driver 130. A resistor 110*f* may be provided in series with the PEFT 110*a* when the NFETS 110*a*, 110*b* are turned on.

Figure 4:
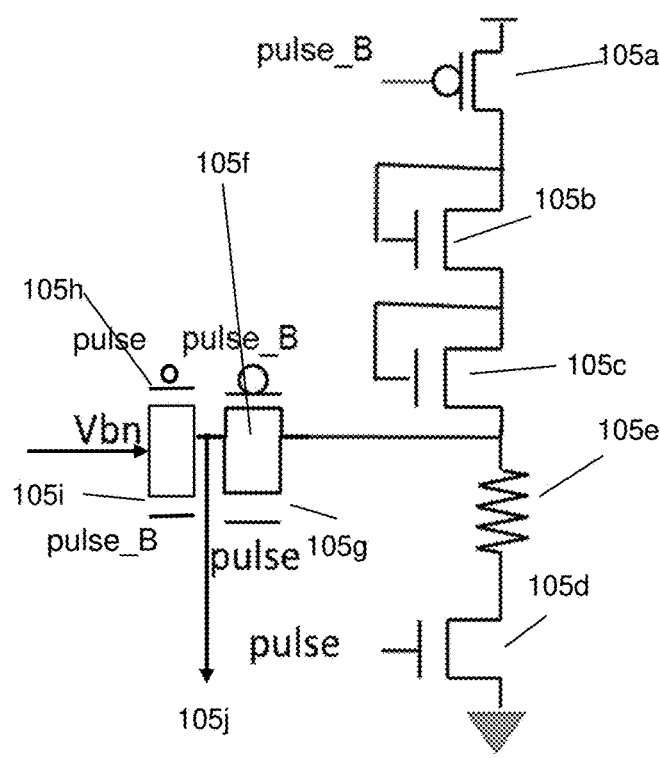
FIGS. 4-6 show representative predefined bias voltage generators in accordance with aspects of the present disclosure.
Figure 5:
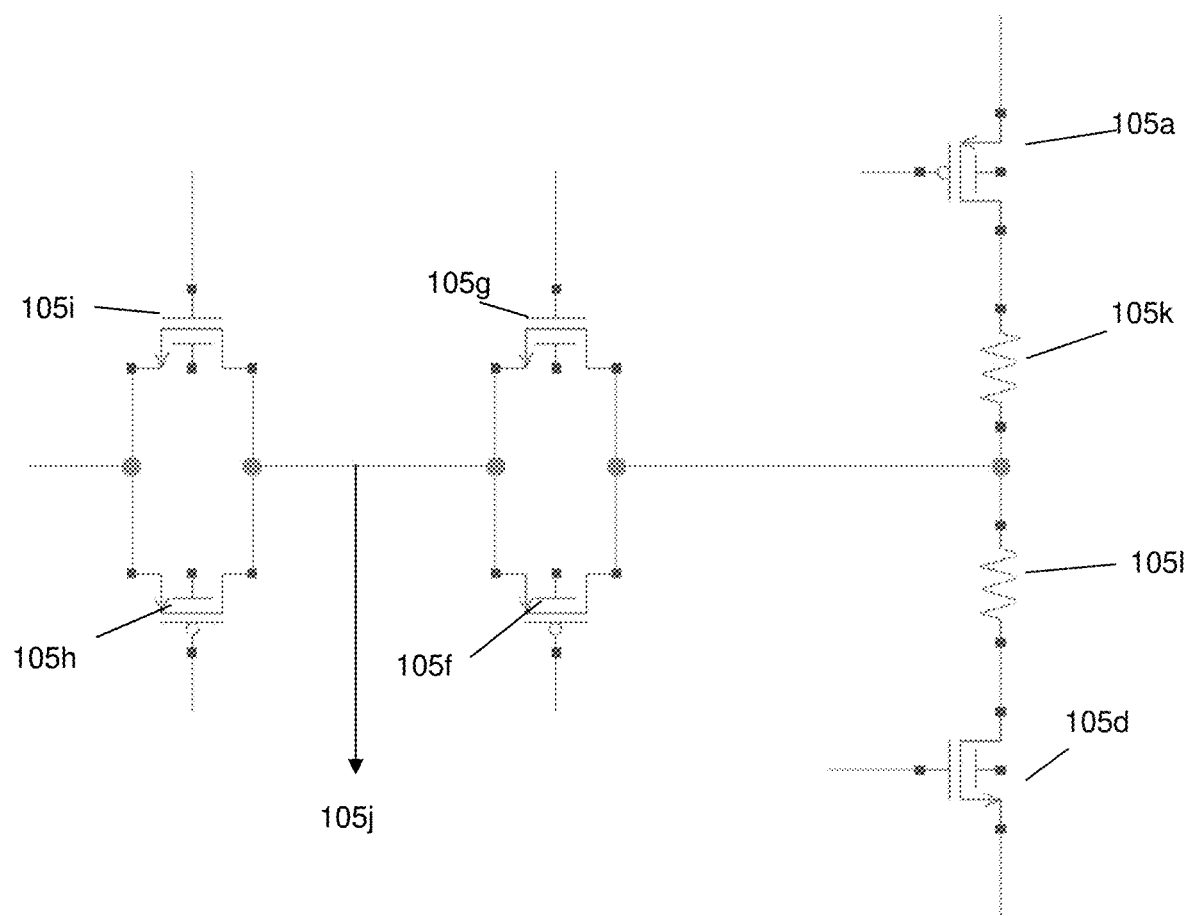
Figure 6:
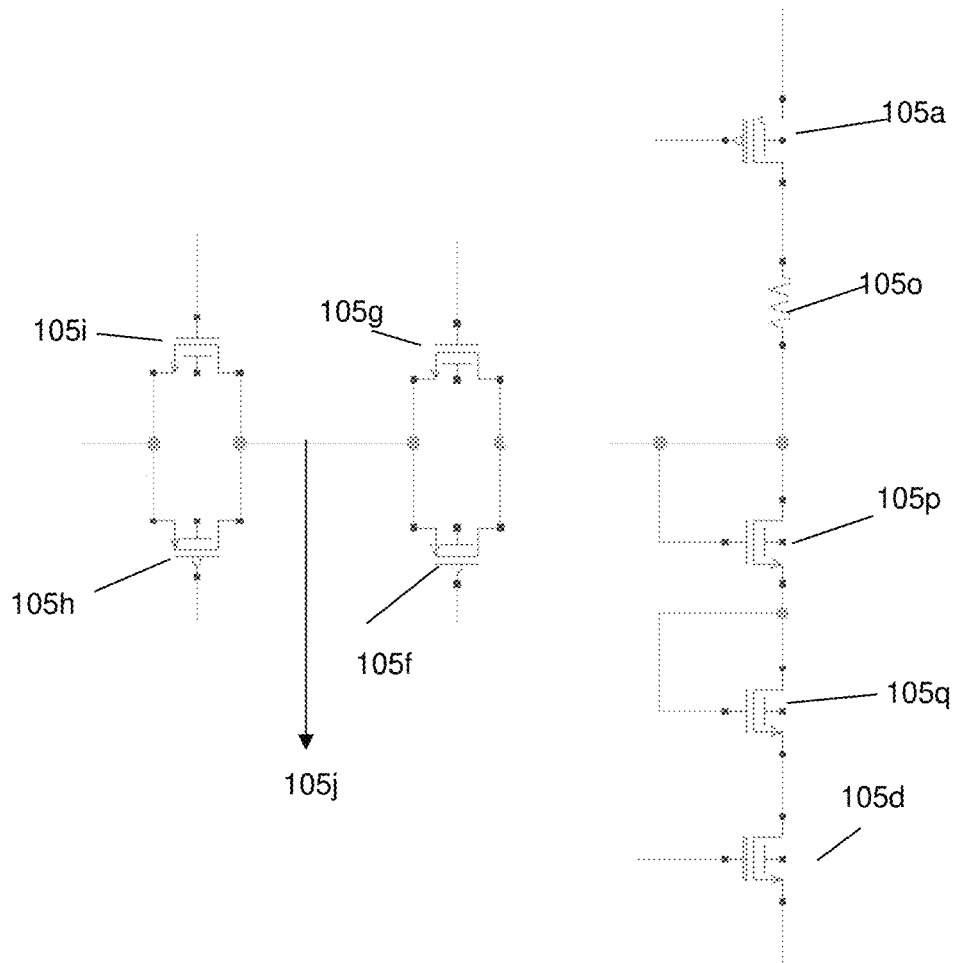

FIGS. 4-6 show representative predefined bias voltage generators used in the circuitry of FIG. 1. In particular, in FIG. 4, the predefined bias voltage generator includes PFETs 105*a*, 105*f* and NFET 105*i* each of which receive signal, pulse_B. In embodiments, the signal, pulse_B, is representative of the signal received from the short pulse generator 100. On the other hand, NFETs 105*d*, 105*g* and PFET 105*h* receive signal, "pulse". The pulse_B signal and pulse signal are complementary signals.

The predefined bias voltage generator further includes NFETS 105*b*, 105*c* in series with a resistor 105*e* and the NFET 105*d*. In addition, transistors 105*f*, 105*g*, e.g., PFET and NFET in parallel, and transistors 105*h*, 105*i*, e.g., NFET and PFET in parallel, are provided between output 105*j*. The pulse_B signal is provided to the PFET 105*f* and NFET 105*i*, whereas the pulse signal is provided to the PFET 105*h* and NFET 105*g*.

In operation, when the signal, pulse_B, is low, the FETs 105*a*, 105*f* turn on (e.g., open). At this operational stage, the pulse is high and the FETs 105*g*, 105*d* are on, the FETs 105*h*, 105*i* are off. In the on state, the FETS 105*b*, 105*c* generate a predefined voltage (e.g., internal bias voltage 1) with resistor 105*e*, which is close to the final voltage, Vbn (or internal bias voltage 2 shown in FIG. 1), to pass through the FET 105*f* and 105*g* to the output 105*j*. As should be understood, the output 105*j* may be provided to the error amplifier. On the other hand, when the final voltage, Vbn is provided by the internal bias generator, e.g., "pulse" is low and pulse_B is high, the FETs 105*a*, 105*f* turn off (e.g., close) and FET 105*h* and 105*i* turn on (e.g., open). In this way, the final voltage, Vbn, will pass to the output 105*j* (e.g., error amplifier).

In FIG. 5, the predefined bias voltage generator includes a resistor chain, e.g., elements 105*k* and 105*l*, with the circuit being gated at the top and the bottom by a short time pulse during wake-up. More specifically, the predefined bias voltage generator may include the PFET 105*a* in series with two resistors 105*k*, 105*l* and NFET 105*d*. In this configuration, the transistors 105*f*-105*i* are similar to that described in FIG. 4. In operation, when the signal, pulse_B, is low the FETs 105*a*, 105*d*, 105*f*, 105*g* turn on (e.g., open), which allows the internal bias voltage to pass to the output 105*j*. At this operational stage, the "pulse" is high.

In FIG. 6, the predefined bias voltage generator may include a resistor 105*o* and two transistors, e.g., NFETs 105*p*, 105*q*, in series with the PFET 105*a* and the NFET 105*d*. In operation, the NFETs 105*p*, 105*q*, act as resistors since the gate and the drain are shorted together. So, effectively the predefined bias voltage generator includes three resistors in series and between PFET 105*a* and NFET 105*d*. In this way it is possible to generate the predefined voltage by changing the value of the resistor 105*o* and the size of the NFETs 105*p*, 105*q*. Accordingly, in embodiments, the final driving FETs can be sized appropriately to reduce the time of charging/discharging load capacitance, and may be turned off after bias stabilization to save power.

Figure 7:
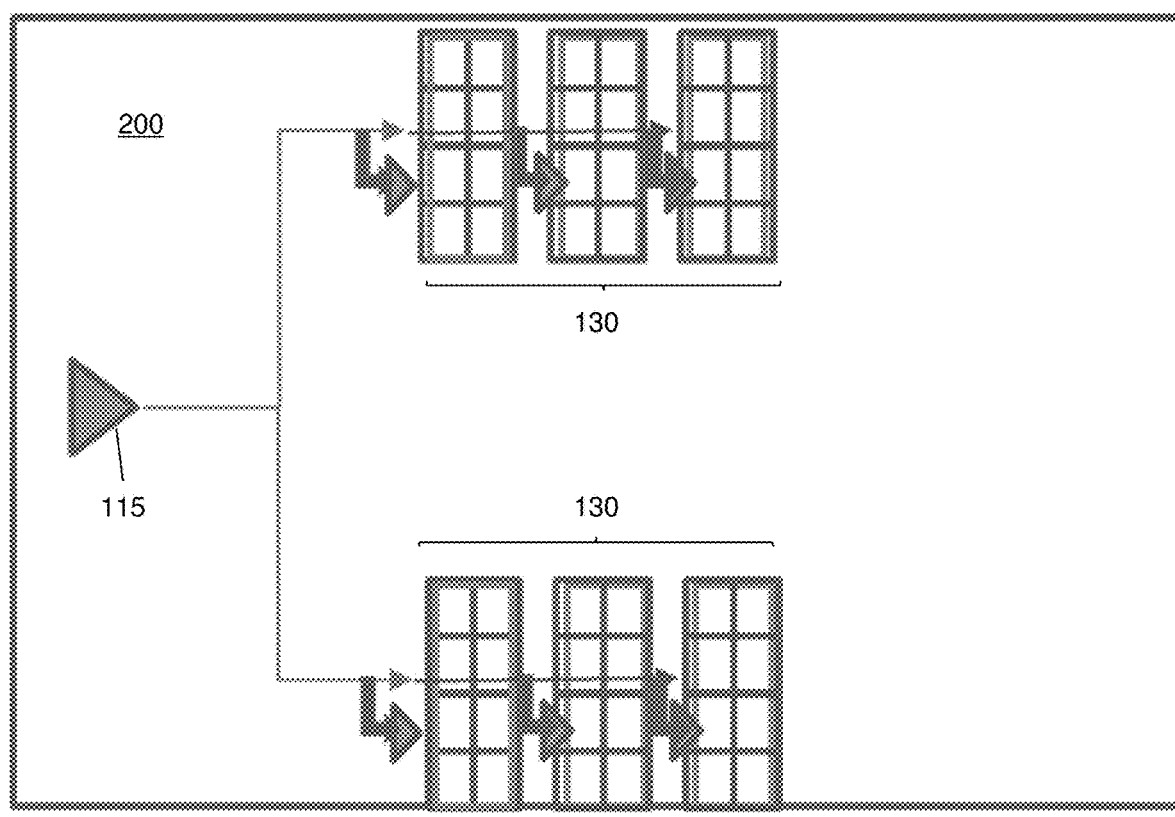
FIG. 7 shows a schematic of distributed final local drivers in accordance with aspects of the present disclosure.

FIG. 7 shows a schematic diagram of distributed final local drivers 200. In more specific embodiments, the voltage generation circuitry may be distributed across the chip. In this way, internal nodes can now be pre-charged to accelerate wake-up time. The internal nodes can be pre-charged to the values close to the final value, where all pre-charge circuits only turn on for a very short period of time during wake-up. In addition, in the distributed bias voltage configuration, each distributed local driver only needs to drive a local load, which results in few capacitive loads from decoupling of capacitors and the power grid.

More specifically, in the schematic of FIG. 7, the error amplifier 115 provides the final voltage to a plurality of distributed local bias drivers 130. In turn, the distributed local bias drivers 130 may drive the power grid. In this way, the distributed local bias drivers 130 may be smaller drivers. Also, in this configuration, there may be less capacitive load from the power grid, as the local bias drivers 130 no longer need to drive a large load because of the distributed network, hence reducing wake-up time. Moreover, as each local bias driver drives a local array slice, minimal power grid is required which provides optimum power consumption due to load management. Also, in this configuration, the output voltage of the error amplifier 115, Vrefg, only goes to the local bias drivers.

Figure 8:
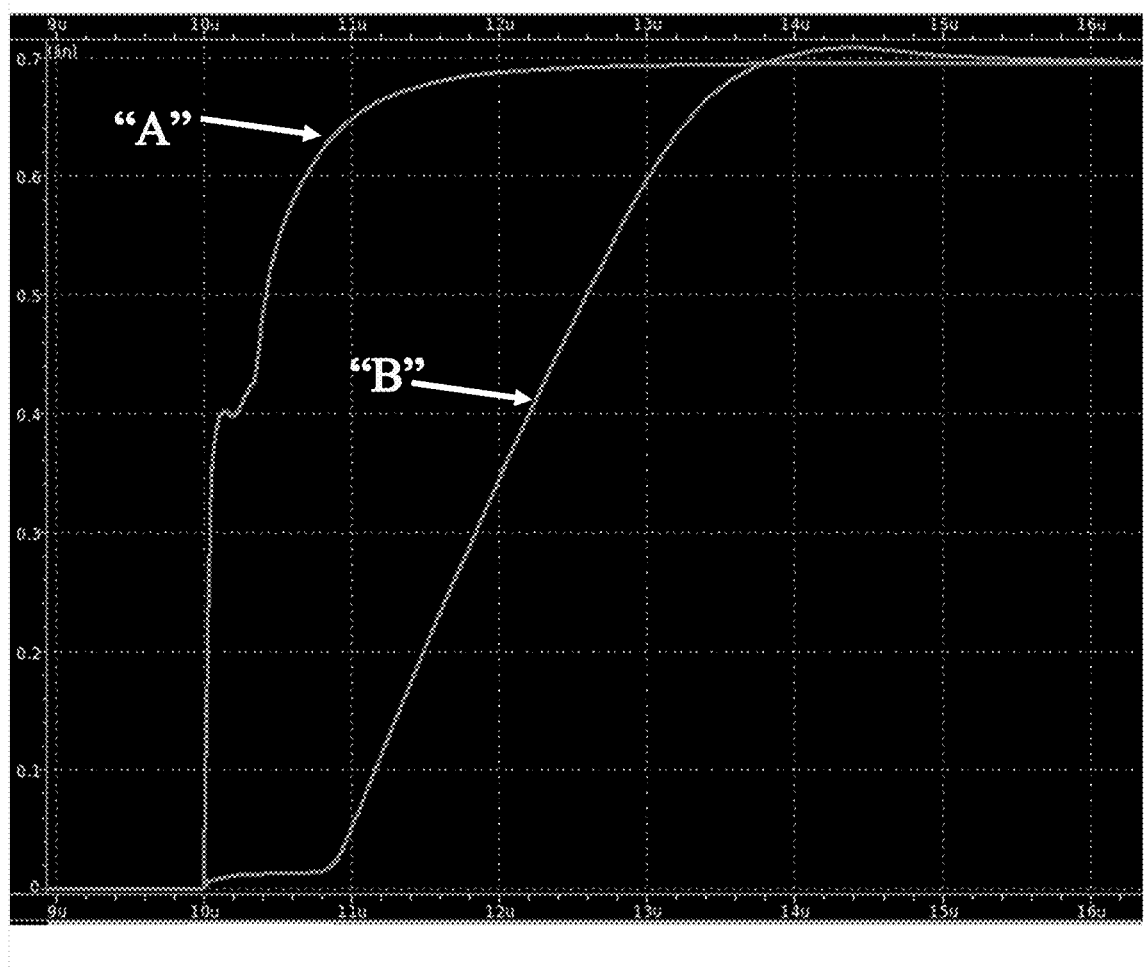
FIG. 8 shows a comparison graph of wake-up times for a conventional circuitry and the voltage generation circuitry in accordance with aspects of the present disclosure.

FIG. 8 shows a comparison graph of wake-up times. In this graph, the x-axis is representative of time (in microseconds) and the y-axis is representative of voltage. Line A is representative of the bias voltage generation circuitry described in the present disclosure and line B is representative of a conventional circuitry. As shown in this graph, the bias voltage generation circuitry provides a shorter wake-up time, e.g., less than 1 microsecond and a faster time to a stable voltage than the conventional circuitry shown in line B thereby enabling power savings.

Figure 9:
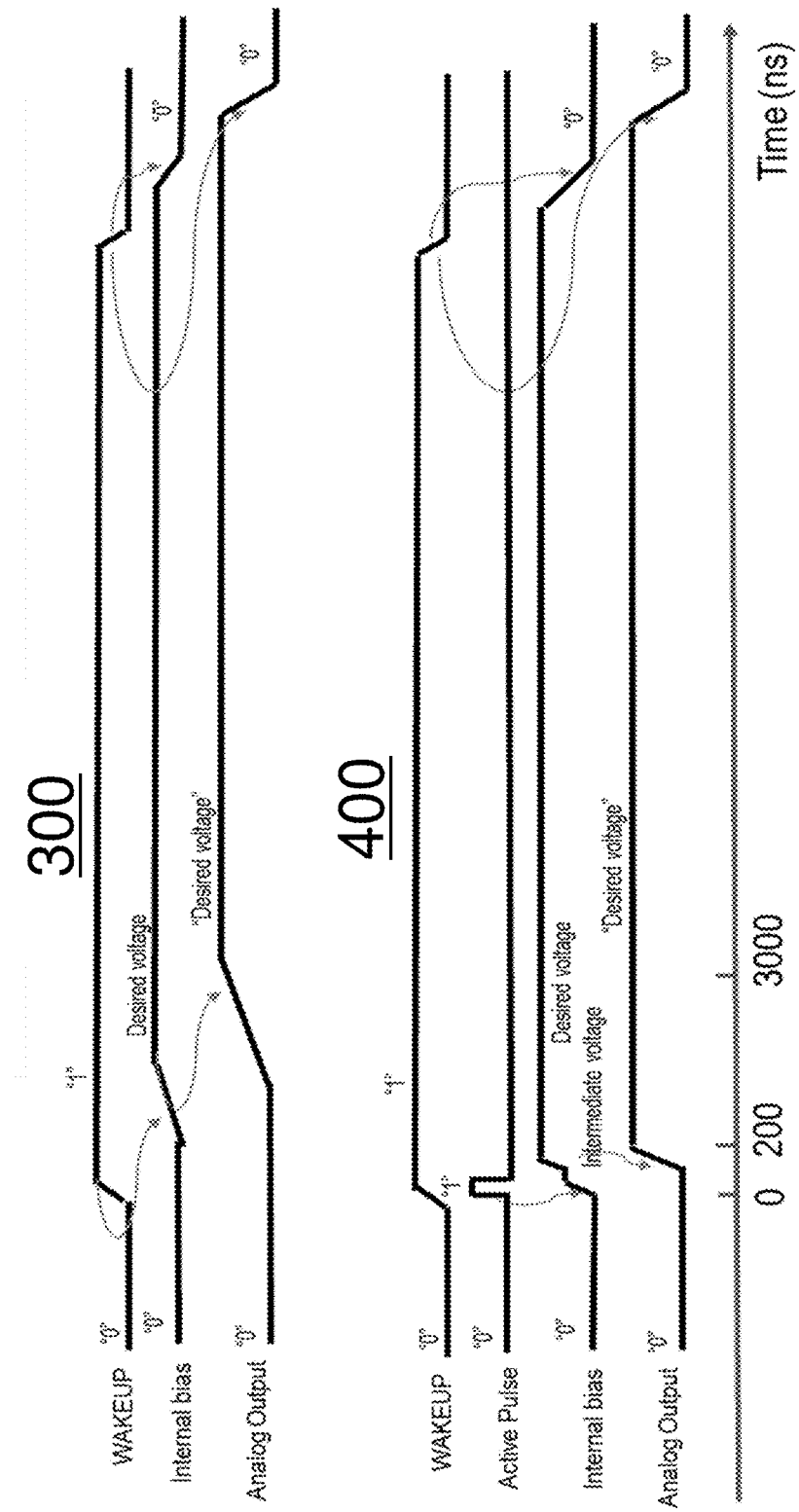
FIG. 9 shows a timing diagram of a conventional circuitry and the voltage generation circuitry in accordance with aspects of the present disclosure.

FIG. 9 shows timing diagrams of a conventional circuitry 300 and the bias voltage generation circuitry described in the present disclosure 400. As shown in the timing diagram 400, the active pulse (e.g., short pulse) is generated at time "0". The active pulse will be used to generate an intermediate bias voltage on the internal bias which, in turn, results in a faster turn on for the desired voltage at the analog output. In comparison, the desired voltage obtained by the bias voltage generation circuitry described in the present disclosure may be about 200 ns, compared to about 3000 ns for the conventional circuitry.

The circuits for bias voltage generation of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit of the present disclosure have been adopted from integrated circuit (IC) technology. For example, the structures are built on wafers and are realized in films of material patterned by photolithographic processes on the top of a wafer. In particular, the fabrication of the circuit uses three basic building blocks: (i) deposition of thin films of material on a substrate, (ii) applying a patterned mask on top of the films by photolithographic imaging, and (iii) etching the films selectively to the mask.

The circuit can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An apparatus, comprising:
   an internal voltage generator providing a bias voltage to at least one internal node of a bias voltage generation circuitry;
   at least one pre-charging circuitry providing a predefined bias voltage to the at least one internal node including a distributed network of local drivers; and
   an error amplifier downstream from the internal voltage generator and the at least one pre-charging circuitry, the error amplifier comparing a final voltage to the predefined bias voltage,
   wherein the at least one pre-charging circuitry comprises a plurality of precharge circuits which turn on for a predefined period of time during wake-up of a non-volatile memory.

2. The apparatus of claim 1, wherein the at least one internal node comprises one or more local drivers.

3. The apparatus of claim 1, wherein the pre-charging circuitry is distributed across a chip.

4. The apparatus of claim 1, wherein the predefined bias voltage accelerates a wake-up time of a read operation in non-volatile memory.

5. The apparatus of claim 1, wherein the predefined bias voltage comprises a value close to a final voltage value of the internal voltage generator.

6. The apparatus of claim 1, wherein the at least one pre-charging circuitry comprises driving FETs sized to reduce a time of charging/discharging load capacitance.

7. The apparatus of claim 6, wherein driving FETs which are turned off after bias stabilization to save power.

8. The apparatus of claim 1, wherein the at least one pre-charging circuitry comprises a chain of resistors.

9. The apparatus of claim 1, wherein the at least one pre-charging circuitry comprises transistors which are shorted together and are in series with a resistor.

10. The apparatus of claim 1, further comprising a short-pulse generator which provides a pulse to the least one pre-charging circuitry.

11. A voltage bias generator comprising:
 a first predefined voltage generator which generates an internal voltage bias to at least one internal node;
 a first internal voltage generator which generates a final internal voltage bias to the at least one internal node;
 a distributed final local driver which receives the final internal voltage bias and provides a local final bias to circuit blocks for non-volatile memory operation; and
 an error amplifier downstream from the first internal voltage generator and a pre-charging circuitry, the error amplifier comparing a final voltage to a predefined bias voltage of the pre-charging circuitry,
 wherein the distributed final local driver includes a second predefined voltage generator and a second internal voltage generator in series with a local bias driver.

12. The voltage bias generator of claim 11, further comprising a short pulse generator that provides a wake-up pulse to the first predefined voltage generator and the second predefined voltage generator.

13. The voltage bias generator of claim 11, wherein the first predefined voltage generator comprises a series of transistors which provide the internal voltage bias to the error amplifier.

14. The voltage bias generator of claim 11, wherein the first predefined voltage generator comprises a resistor chain.

15. The voltage bias generator of claim 11, wherein the first predefined voltage generator comprises transistors which are shorted together and are in series with a resistor.

16. A method, comprising:
 providing a predefined bias voltage to at least one internal node of a bias voltage generation circuitry; and
 providing a final bias voltage to at least one internal node; and
 providing a final bias voltage by using distributed local drivers of the bias voltage generation circuitry,
 wherein the at least one internal node includes an error amplifier which compares the precharge bias voltage to the final bias voltage and sends the final bias voltage to a distributed network of local drivers,
 wherein the final bias voltage to at least one internal node is provided by driving FETs which are turned off after bias stabilization to save power.

* * * * *